(12) United States Patent
Mizuno et al.

(10) Patent No.: US 9,142,753 B2
(45) Date of Patent: Sep. 22, 2015

(54) PIEZOELECTRIC ACTUATOR AND LIQUID JETTING APPARATUS

(71) Applicant: Brother Kogyo Kabushiki Kaisha, Nagoya-shi, Aichi-Ken (JP)

(72) Inventors: Taisuke Mizuno, Nagoya (JP); Mizuyo Takebayashi, Nagoya (JP); Kyohei Naito, Nagoya (JP); Shotaro Kanzaki, Nagoya (JP); Masato Sueyasu, Nagoya (JP); Keiji Kura, Chita (JP)

(73) Assignee: Brother Kogyo Kabushiki Kaisha, Aichi-ken (JP)

( * ) Notice: Subject to any disclaimer, the term of this patent is extended or adjusted under 35 U.S.C. 154(b) by 0 days.

(21) Appl. No.: 14/446,426

(22) Filed: Jul. 30, 2014

(65) Prior Publication Data
US 2015/0035906 A1 Feb. 5, 2015

(30) Foreign Application Priority Data

Jul. 31, 2013 (JP) ................. 2013-159708

(51) Int. Cl.
*B41J 2/14* (2006.01)
*H01L 41/09* (2006.01)
*H01L 41/047* (2006.01)

(52) U.S. Cl.
CPC ......... *H01L 41/0926* (2013.01); *B41J 2/14209* (2013.01); *H01L 41/0973* (2013.01); *B41J 2002/14459* (2013.01); *B41J 2002/14491* (2013.01); *H01L 41/0471* (2013.01)

(58) Field of Classification Search
CPC ...... B41J 2/14233; B41J 2/14; B41J 2/12274; B41J 2/14282; H01L 41/09

USPC ............................................. 347/50
See application file for complete search history.

(56) References Cited

U.S. PATENT DOCUMENTS

| 6,450,626 | B2* | 9/2002 | Ikeda et al. ..................... 347/70 |
| 8,353,578 | B2* | 1/2013 | Matsuura ......................... 347/68 |
| 2008/0239020 | A1* | 10/2008 | Sugahara ......................... 347/70 |
| 2009/0096844 | A1* | 4/2009 | Kojima et al. .................. 347/72 |
| 2009/0244205 | A1* | 10/2009 | Kura ................................ 347/68 |
| 2012/0186859 | A1 | 7/2012 | Yamashita |

FOREIGN PATENT DOCUMENTS

| JP | 08-118630 | 5/1996 |
| JP | 2012-156185 | 8/2012 |

* cited by examiner

*Primary Examiner* — Alessandro Amari
*Assistant Examiner* — Michael Konczal
(74) *Attorney, Agent, or Firm* — Frommer Lawrence & Haug LLP

(57) ABSTRACT

There is provided a piezoelectric actuator, including: first and second piezoelectric layers; a driving electrode arranged between the first and second piezoelectric layers; a second electrode maintained at a predetermined first electrical potential; and a third electrode maintained at a second electrical potential. A neutral plane of the piezoelectric actuator is positioned at a side opposite to the second piezoelectric layer relative to a center plane of the first piezoelectric layer in a direction of stacking of the first and second piezoelectric layers. A first portion of the first piezoelectric layer is sandwiched between the driving electrode and the second electrode, and a second portion of the second piezoelectric layer is sandwiched between the driving electrode and the third electrode. The first and second portions are polarized parallel to the stacking direction such that they are polarized in mutually opposite directions.

13 Claims, 12 Drawing Sheets

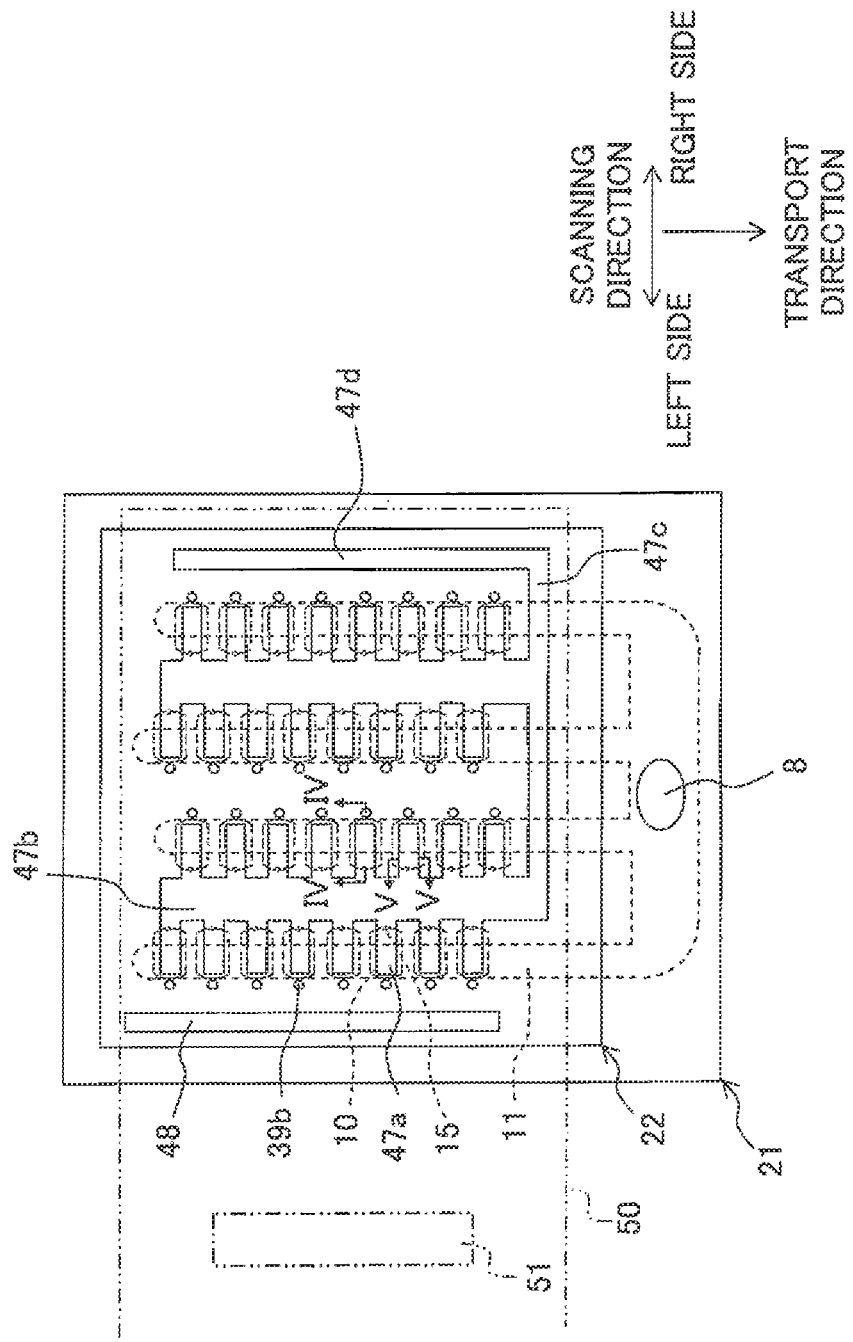

TRANSPORT
DIRECTION

TRANSPORT
DIRECTION

TRANSPORT DIRECTION

TRANSPORT DIRECTION

TRANSPORT
DIRECTION

TRANSPORT DIRECTION

PIEZOELECTRIC ACTUATOR AND LIQUID JETTING APPARATUS

CROSS REFERENCE TO RELATED APPLICATION

The present application claims priority from Japanese Patent Application No. 2013-159708, filed on Jul. 31, 2013, the disclosure of which is incorporated herein by reference in its entirety.

BACKGROUND

1. Field of the Invention

The present invention relates to a piezoelectric actuator used for a liquid jetting apparatus or the like which is configured to jet liquid from nozzles, and the liquid jetting apparatus including the piezoelectric actuator.

2. Description of the Related Art

As a piezoelectric actuator used for an ink-jet head, there is conventionally known a piezoelectric actuator including two piezoelectric layers, a common electrode, and a plurality of individual electrodes. The two piezoelectric layers are stacked on each other to continuously extend over a plurality of pressure chambers. The common electrode is positioned between the two piezoelectric layers to extend over therebetween, and the common electrode is kept at a ground potential. The individual electrodes are respectively arranged on the upper surface of the upper piezoelectric layer positioned on the upper side at portions overlapping with the pressure chambers, and a driving signal is input to the individual electrodes. The portions, of the upper piezoelectric layer, sandwiched between the individual electrodes and the common electrode are polarized in a direction parallel to a thickness direction of the piezoelectric layers. When the driving signal is input to the individual electrodes to cause the potential difference between the individual electrodes and the common electrode, an electric field in a direction parallel to the polarization direction occurs in the portions, of the upper piezoelectric layer, sandwiched between the individual electrodes and the common electrode. This electric field causes the portions of the upper piezoelectric layer to contract in a planar direction. As a result, portions, of the two piezoelectric layers, overlapping with the pressure chambers bend to be convex toward the pressure chambers as a whole. At this time, the volume of each of the pressure chambers is reduced to increase a pressure of the ink in each of the pressure chambers, thereby jetting the ink from each of the nozzles connected to one of the pressure chambers.

SUMMARY

The ink-jet head having the piezoelectric actuator is sometimes required to arrange nozzles high densely in order to achieve speed-up of printing, high image quality, and the like. Downsizing of the pressure chambers is needed to arrange the nozzles high densely, if the pressure chambers are downsized. However, the portions, of the piezoelectric layer, overlapping with the pressure chambers also become small. As a result, a bending amount of the portion, of the piezoelectric layer, overlapping with each pressure chamber at the time of driving the piezoelectric actuator decreases, thereby reducing the volume of the ink jetted from each of the nozzles.

It is possible to increase the bending amount of the portion, of the piezoelectric layer, overlapping with each pressure chamber, for example, by increasing the electrical potential applied to each individual electrode and/or making the piezoelectric layer thinner. However, if the electrical potential applied to each individual electrode is increased and/or the piezoelectric layer is made to be thinner, there is fear that insulation of the piezoelectric layer might be broken.

An object of the present teaching is to provide a piezoelectric actuator which is capable of increasing a bending amount and a liquid jetting apparatus provided with the piezoelectric actuator.

According to a first aspect of the present teaching, there is provided a piezoelectric actuator, including:

a first piezoelectric layer;

a second piezoelectric layer;

a first electrode arranged between the first piezoelectric layer and the second piezoelectric layer;

a second electrode arranged so that the first piezoelectric layer is sandwiched between the second electrode and the first electrode and configured to be maintained at a first electrical potential; and a third electrode arranged so that the second piezoelectric layer is sandwiched between the third electrode and the first electrode and configured to be maintained at a second electrical potential different from the first electrical potential, wherein a neutral plane of the piezoelectric actuator is positioned at a side opposite to the second piezoelectric layer relative to a center plane of the first piezoelectric layer in a direction of stacking of the first and second piezoelectric layers; and wherein a first portion of the first piezoelectric layer is sandwiched between the first electrode and the second electrode, and a second portion of the second piezoelectric layer is sandwiched between the first electrode and the third electrode, wherein the first and second portions are polarized parallel to the direction of stacking of the first and second piezoelectric layers, and wherein a direction of polarization of the first portion is opposite to a direction of polarization of the second portion.

According to a second aspect of the present teaching, there is provided a liquid jetting apparatus, including:

a channel unit in which a liquid channel including a pressure chamber is formed;

a piezoelectric actuator configured to apply pressure to liquid in the pressure chamber; and a driving device configured to drive the piezoelectric actuator, the piezoelectric actuator including:

a first piezoelectric layer arranged to cover the pressure chamber;

a second piezoelectric layer;

a first electrode arranged between the first piezoelectric layer and the second piezoelectric layer to overlap with the pressure chamber;

a second electrode arranged so that a portion, of the first piezoelectric layer, overlapping with the pressure chamber is sandwiched between the second electrode and the first electrode; and a third electrode arranged so that a portion, of the second piezoelectric layer, overlapping with the pressure chamber is sandwiched between the third electrode and the first electrode, wherein a neutral plane of the piezoelectric actuator is positioned at a side opposite to the second piezoelectric layer relative to a center plane of the first piezoelectric layer in a direction of stacking of the first and second piezoelectric layers, wherein a first portion of the first piezoelectric layer is sandwiched between the first electrode and the second electrode, and a second portion of the second piezoelectric layer is sandwiched between the first electrode and the third electrode, wherein the first and second portions are polarized parallel to the direction of stacking of the first and second piezoelectric layers, and wherein a direction of polarization of the first portion is opposite to a direction of polarization of the second portion; and the driving device being configured to:

apply a first electrical potential to the second electrode;

apply a second electrical potential different from the first electrical potential to the third electrode; and selectively apply, to the first electrode, one of a first driving potential and a second driving potential, the first driving potential generating an electric field in a direction which is the same as a polarization direction in one of the first and second portions and the second driving potential generating an electric field in a direction opposite to the polarization direction in the other of the first and second portions.

According to a third aspect of the present teaching, there is provided a piezoelectric actuator, including:

a first piezoelectric layer;

a second piezoelectric layer;

a first electrode arranged between the first piezoelectric layer and the second piezoelectric layer;

a second electrode arranged so that the first piezoelectric layer is sandwiched between the second electrode and the first electrode and configured to be maintained at a predetermined first electrical potential; and a third electrode arranged so that the second piezoelectric layer is sandwiched between the third electrode and the first electrode and configured to be maintained at a second electrical potential different from the first electrical potential, wherein a first portion of the first piezoelectric layer is sandwiched between the first electrode and the second electrode, and a second portion of the second piezoelectric layer is sandwiched between the first electrode and the third electrode, wherein the first and second portions are polarized parallel to the direction of stacking of the first and second piezoelectric layers, wherein a direction of polarization of the first portion is opposite to a direction of polarization of the second portion, wherein the piezoelectric actuator is configured to bend toward one side in the direction of stacking of the first and second piezoelectric layers, in a case that a first driving potential, which generates an electric field in a direction which is the same as a polarization direction in one of the first and second portions, is applied to the first electrode, and wherein the piezoelectric actuator is configured to bend toward an opposite side of said one side in the direction of stacking of the first and second piezoelectric layers, in a case that a second driving potential, which generates an electric field in a direction opposite to the polarization direction in the other of the first and second portions, is applied to the first electrode.

The neutral plane of the piezoelectric actuator may be positioned at the side opposite to the second piezoelectric layer relative to the center plane of the first piezoelectric layer, because of the relations among Young's modulus of respective piezoelectric layers and respective electrodes; thicknesses of respective piezoelectric layers; areas of respective electrodes; and the like. In the present teaching, the first portion and the second portion are polarized in mutually opposite directions. In a case that the electric field in the direction which is the same as the polarization direction is generated in one of the first and second portions, said one of the first and second portions contracts in a planar direction, and in a case that the electric field in the direction opposite to the polarization direction is generated in the other of the first and second portions, said other of the first and second portions expands in the planar direction. By allowing the first and second portions to contract and expand respectively as described above in the piezoelectric actuator in which the neutral plane is located at the above-described position, the piezoelectric actuator bends toward both sides in the direction of stacking of the piezoelectric layers. Accordingly, it is possible to increase the bending amount of the piezoelectric actuator.

BRIEF DESCRIPTION OF THE DRAWINGS

FIG. 2 is a plan view of an ink-jet head.

FIG. 3A to 3C each show an upper surface of each piezoelectric layer shown in FIG. 2, wherein FIG. 3A shows the upper surface of a lower piezoelectric layer, FIG. 3B shows the upper surface of a middle piezoelectric layer, and FIG. 3C shows the upper surface of an upper piezoelectric layer.

FIGS. 5A and 5B each show a cross-sectional view taken along the line V-V in FIG. 2, wherein FIG. 5A shows directions of polarization of the piezoelectric layers and FIG. 5B shows a position of a neutral plane of a piezoelectric actuator.

FIGS. 6A and 6B each show the piezoelectric actuator at the time of being driven, wherein FIG. 6A shows a state that a ground potential is applied to an intermediate electrode, and FIG. 6B shows a state that a driving potential is applied to the intermediate electrode.

DESCRIPTION OF THE EMBODIMENTS

Hereinbelow, embodiment(s) of the present teaching will be explained.

Figure 1:
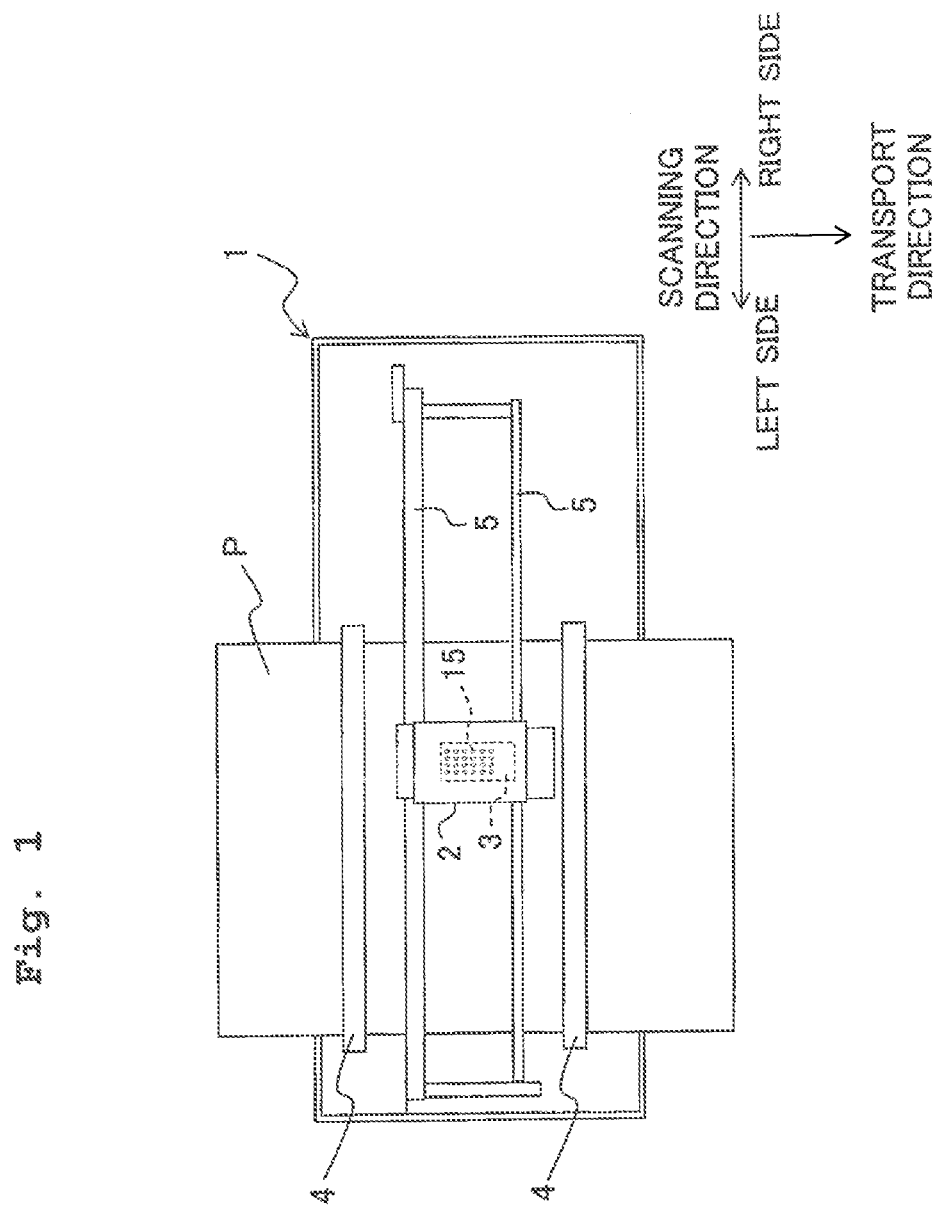
FIG. 1 is a schematic configuration diagram of a printer according to an embodiment of the present teaching.
Figure 3A:
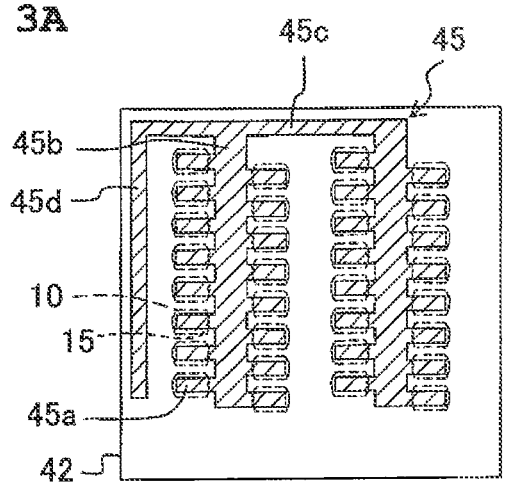
Figure 3B:
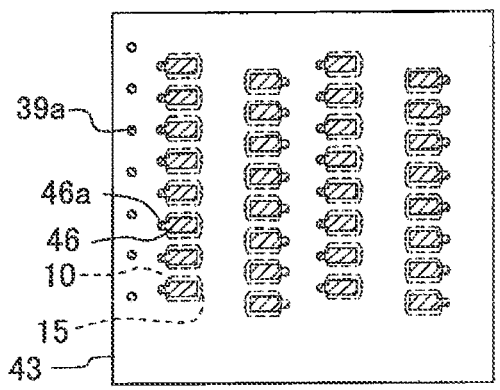
Figure 3C:
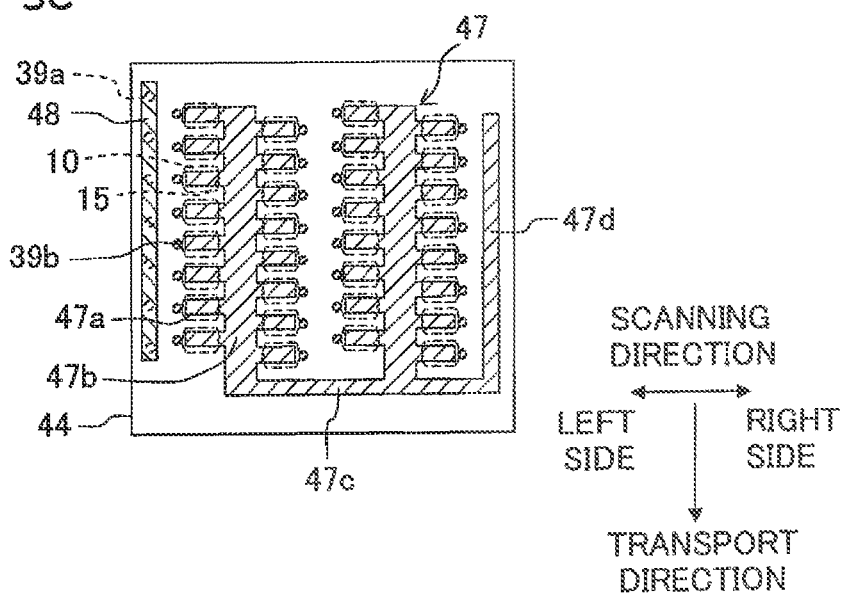
Figure 4:
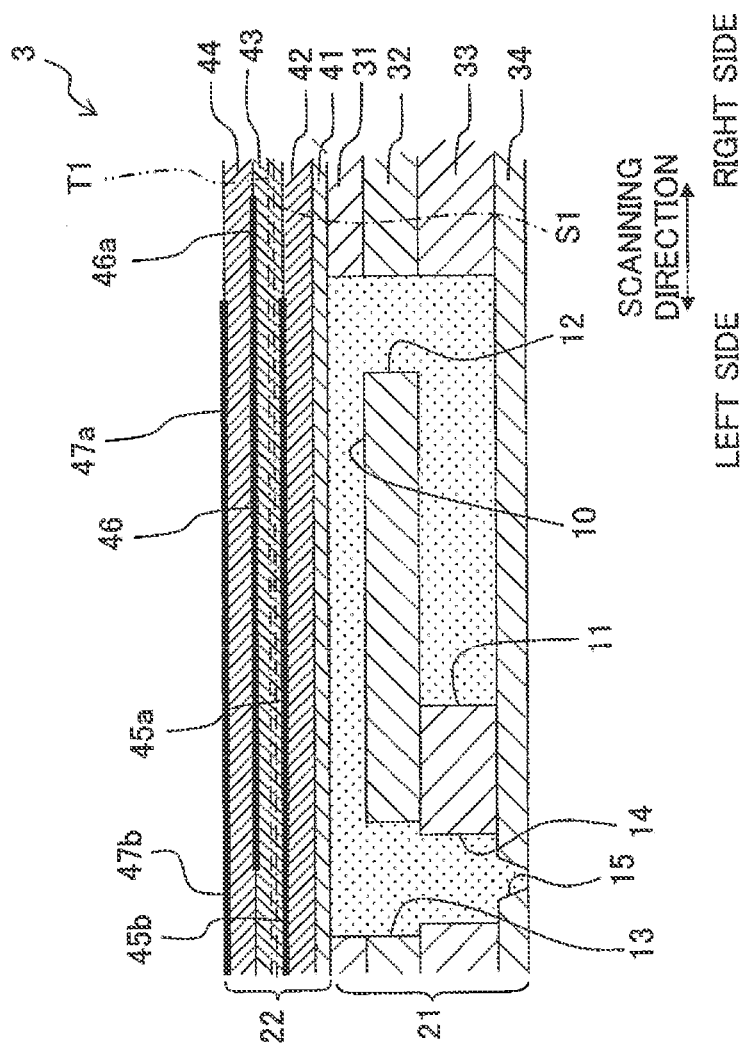
FIG. 4 is a cross-sectional view taken along the line IV-IV in FIG. 2.

As shown in FIG. 1, a printer 1 according to this embodiment includes a carriage 2, an ink-jet head 3, transport rollers 4, and the like. The carriage 2 is supported by two guide rails 5 extending in a scanning direction, and the carriage 2 is movable along the guide rails 5 in the scanning direction. In the following explanation, the right side and the left side in the scanning direction are defined as shown in FIG. 1. The ink-jet head 3 is carried on the carriage 2, and the ink-jet head 3 jets ink from a plurality of nozzles 15 formed on the lower surface of the ink-jet head 3. The transport rollers 4 are disposed on both sides of the carriage 2 in a transport direction perpendicular to the scanning direction, and the transport rollers 4 transport a sheet of recording paper P in the transport direction. In the printer 1, the ink is jetted from the ink-jet head 3 which is moved reciprocatively in the scanning direction together with the carriage 2, while the recording paper P is transported in the transport direction by the transport rollers 4. Thus, printing is performed on the recording paper P.

Figure 5A:
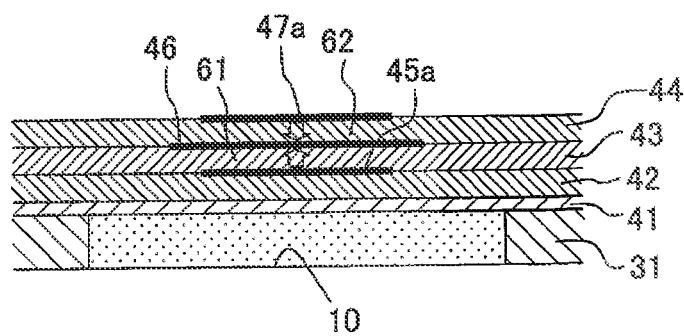
Figure 5B:
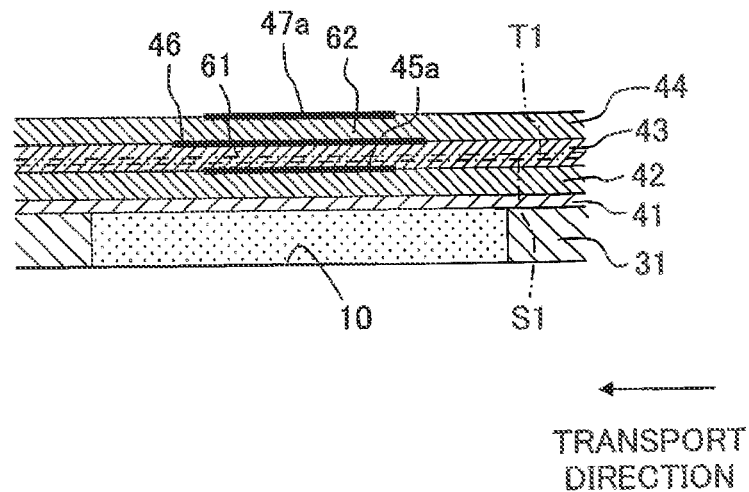

Next, the ink-jet head 3 will be explained. As shown in FIGS. 2 to 5, the ink-jet head 3 includes a channel unit 21 in which ink channels including the nozzles 15, pressure chambers 10 which will be described later, and the like are formed, and a piezoelectric actuator 22 for applying pressure to the ink in each of the pressure chambers 10. To make the diagram easily understandable, illustrations of the ink channels other than the nozzles 15 and the pressure chambers 10 formed in the channel unit 21; a lower electrode; intermediate electrodes; and the like are omitted in FIG. 2. In FIGS. 5A and 5B, only a plate 31 which will be described later is illustrated from among components or parts included in the channel unit 21.

The channel unit 21 is formed such that four plates 31 to 34 are stacked on each other. Of the four plates 31 to 34, three plates 31 to 33 are formed of a metallic material such as stainless steel. The plate 34 is formed of a synthetic-resin material such as polyimide. Alternatively, the plate 34 may be formed of the metallic material similar to the plates 31 to 33.

The pressure chambers 10 are formed in the plate 31. Each of the pressure chambers 10 has an approximate rectangular shape, in a plan view, which is elongated in the scanning direction. The pressure chambers 10 are arranged to form four pressure chamber arrays 9. In each of the pressure chamber arrays 9, the pressure chambers 10 are arranged in the transport direction at constant intervals. The four pressure chamber arrays 9 are arranged side by side in the scanning direction in the plate 31. The pressure chambers 10 constructing the first and third pressure chamber arrays 9 from the left side and the pressure chambers 10 constructing the second and fourth pressure chamber arrays 9 from the left side are positioned off or shifted each other in the transport direction by half of the spacing distance between pressure chambers 10 in each of the pressure chamber arrays 9.

A plurality of through holes 12 each having a substantially circular shape in a plan view are formed at portions, of the plate 32, overlapping with right end portions of the pressure chambers 10 constructing the first and third pressure chamber arrays 9 from the left side and portions, of the plate 32, overlapping with left end portions of the pressure chambers 10 constructing the second and fourth pressure chamber arrays 9 from the left side. Further, a plurality of through holes 13 each having a substantially circular shape in a plan view are formed at portions, of the plate 32, overlapping with left end portions of the pressure chambers 10 constructing the first and third pressure chamber arrays 9 from the left side and portions, of the plate 32, overlapping with right end portions of the pressure chambers 10 constructing the second and fourth pressure chamber arrays 9 from the left side.

Four manifold channels 11 are formed in the plate 33. The four manifold channels 11 correspond to the four pressure chamber arrays 9, respectively. Each of the four manifold channels 11 extends over the pressure chambers 10 constructing one of the pressure chamber arrays 9 in the transport direction. Each of the manifold channels 11 overlaps with substantially half portions, of the pressure chambers 10 constructing one of the pressure chamber arrays 9, on the side of the through holes 12 in the scanning direction. The end portions of the four manifold channels 11 are connected with each other on the downstream side in the transport direction. The ink is supplied to the four manifold channels 11 from an ink supply port 8 provided at the connecting portion of the end portions of the four manifold channels 11 on the downstream side in the transport direction.

A plurality of through holes 14 each having a substantially circular shape in a plan view are formed at portions, of the plate 33, overlapping with the through holes 13. The nozzles 15 are formed at portions, of the plate 34, overlapping with the through holes 13.

The piezoelectric actuator 22 includes an ink separating layer 41, piezoelectric layers 42 to 44, a lower electrode 45, a plurality of intermediate electrodes 46, and an upper electrode 47. The ink separating layer 41 is formed of a metallic material such as stainless steel, and the ink separating layer 41 is arranged on the upper surface of the channel unit 21 to cover the pressure chambers 10. The ink separating layer 41 is provided to prevent the ink in each pressure chamber 10 from making contact with the piezoelectric layer 42 which will be explained next.

The piezoelectric layer 42 is made of a piezoelectric material composed mainly of lead zirconate titanate which is a mixed crystal of lead titanate and lead zirconate. The piezoelectric layer 42 is arranged on the upper surface of the ink separating layer 41 to continuously extend over the pressure chambers 10. The piezoelectric layer 43 is formed of a similar piezoelectric material as the piezoelectric layer 42, and the piezoelectric layer 43 is disposed on the upper surface of the piezoelectric layer 42. The piezoelectric layer 44 is formed of a similar piezoelectric material as the piezoelectric layers 42, 43, and the piezoelectric layer 44 is disposed on the upper surface of the piezoelectric layer 43. The piezoelectric layers 42 to 44 are formed by baking a green sheet as the piezoelectric material. Or, the piezoelectric layers 42 to 44 may be formed by using a publicly-known film formation method such as a sol-gel method, a sputtering method, and an aerosol deposition method (AD method).

The lower electrode 45 is arranged between the piezoelectric layers 42 and 43. The lower electrode 45 includes a plurality of overlapping portions 45a, two connecting portions 45b, another connecting portion 45c, and an extended portion 45d. Each of the overlapping portions 45a has an approximate rectangular shape, in a plan view, which is elongated in the scanning direction, and overlaps with a center portion of one of the pressure chambers 10 in the transport direction. The two connecting portions 45b are respectively arranged in areas overlapping with a space between the first and second pressure chamber arrays 9 from the left side and a space between the third and fourth pressure chamber arrays 9 from the left side to extend in the transport direction. Each of the connecting portions 45b mutually connects end portions of the overlapping portions 45a, which correspond to two pressure chamber arrays 9 positioned on both sides of the connecting portion 45b in the scanning direction, on the side of nozzles 15 in the scanning direction. The connecting portion 45c extends in the scanning direction to mutually connect end portions of two connecting portions 45b on the upstream side in the transport direction. The extended portion 45d is extended from the left end portion of the connecting portion 45c to the downstream side in the transport direction. The extended portion 45d is pulled out to the upper surface of the piezoelectric layer 44 via plated through holes 39a formed in the piezoelectric layers 43, 44 to be connected to a surface electrode 48 arranged in a portion, of the upper surface of the piezoelectric layer 44, overlapping with the extended portion 45d.

The intermediate electrodes 46 are provided corresponding to the pressure chambers 10 individually. Each of the intermediate electrodes 46 has an approximate rectangular shape, in a plan view, and is arranged to overlap with almost the entire area of one of the pressure chambers 10. Accordingly, each of the intermediate electrodes 46 is longer, in the transport direction, than each of the overlapping portions 45a of the lower electrode 45. Each of the intermediate electrodes 46 extends out beyond one of the overlapping portions 45a, in a plan view, at both sides in the transport direction. The end portion of each of the intermediate electrodes 46 on the side opposite to the nozzle 15 in the scanning direction is extended to a position not overlapping with one of the pressure chambers 10 in the scanning direction, and the front end portion thereof functions as a connecting terminal 46a. Each connecting terminal 46a is pulled out to the upper surface of the piezoelectric layer 44 via each plated through hole 39b formed in the piezoelectric layer 44.

The upper electrode 47 is arranged on the upper surface of the piezoelectric layer 44. The upper electrode 47 includes a plurality of overlapping portions 47a, two connecting portions 47b, another connecting portion 47c, and an extended portion 47d. Each of the overlapping portions 47a has an approximate rectangular shape, in a plan view, which is the substantially same as that of the overlapping portion 45a of the lower electrode 45. Each of the overlapping portions 47a overlaps with a center portion of one of the pressure chambers 10. Thus, each of the intermediate electrodes 46 extends out also beyond one of the overlapping portions 47a, in a plan view, at both sides in the transport direction. The two connecting portions 47b are respectively arranged in areas overlapping with a space between the first and second pressure chamber arrays 9 from the left side and a space between the third and fourth pressure chamber arrays 9 from the left side, to extend in the transport direction. Each of the connecting portions 47b mutually connects end portions of the overlapping portions 47a, which correspond to two pressure chamber arrays 9 positioned on both sides of the connecting portion 47b in the scanning direction, on the side of nozzles 15 in the scanning direction. The connecting portion 47c extends in the scanning direction to mutually connect end portions of two connecting portions 47b on the downstream side in the transport direction. The extended portion 47d is extended from the right end portion of the connecting portion 47c to the upstream side in the transport direction.

A Chip On Film (COF) 50 is disposed above the piezoelectric actuator 22. A driver IC 51 is mounted on the COF 50. The driver IC 51 is connected to the surface electrode 48 arranged on the upper surface of the piezoelectric layer 44 via unillustrated wiring lines formed in the COF 50. The lower electrode 45 is maintained at a ground potential by the driver IC 51.

The driver IC 51 is connected to the extended portion 47d of the upper electrode 47 arranged on the upper surface of the piezoelectric layer 44 via unillustrated wiring lines of the COF 50. The upper electrode 47 is kept at a predetermined driving potential such as 20 V which is different from the ground potential, by the driver IC 51.

The driver IC 51 is individually connected, via unillustrated wiring lines of the COF 50, to the intermediate electrodes 46 pulled out to the upper surface of the piezoelectric layer 44 via the plated through holes 39b. Any of the ground potential and the driving potential is selectively applied to the intermediate electrodes 46 individually by the driver IC 51.

In accordance with the above arrangement of the electrodes 45 to 47, a first active portion 61 which is a portion, of the piezoelectric layer 43, sandwiched between the overlapping portion 45a of the lower electrode 45 and the intermediate electrode 46 is polarized in an upward direction. Further, a second active portion 62 which is a portion, of the piezoelectric layer 44, sandwiched between the intermediate electrode 46 and the overlapping portion 47a of the upper electrode 47 is polarized in a downward direction. That is, the first active portion 61 and the second active portion 62 are polarized parallel to the upward-downward direction in mutually opposite directions.

The piezoelectric actuator 22 is configured so that the ink separating layer 41 and the piezoelectric layer 42 are arranged on the side lower than the piezoelectric layers 43, 44. The ink separating layer 41 is made of a metallic material of which Young's modulus is higher than the piezoelectric material. Therefore, a neutral plane S1 of the piezoelectric actuator 22 is located at a position on a lower side of a center plane T1 of the piezoelectric layer 43 in the thickness direction because of the relations among Young's modulus of the ink separating layer 41, the piezoelectric layers 42 to 44, and the electrodes 45 to 47; the thicknesses of the ink separating layer 41 and the piezoelectric layers 42 to 44; the areas of the electrodes 45 to 47; and the like, as shown in FIG. 5B. In this context, the neutral plane is a plane which neither expands nor contract when the bending moment is applied to the piezoelectric actuator 22 which is not fixed to the channel unit 21.

Figure 6A:
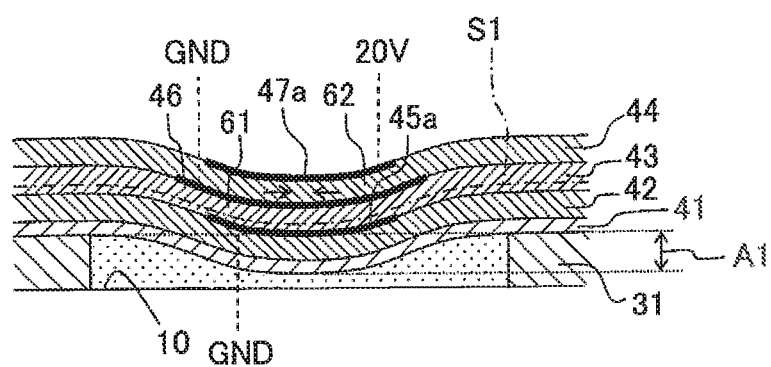

Next, an explanation will be made about a method for jetting ink from the nozzles 15 by driving the piezoelectric actuator 22. In the piezoelectric actuator 22, the electrical potential of all of the intermediate electrodes 46 is kept at the ground potential in advance. In this state, an electric field is generated in the second active portion 62 in a direction which is the same as the polarization direction due to the potential difference between the intermediate electrode 46 and the upper electrode 47. This electric field causes the second active portion 62 to contract in a planar direction. In this embodiment, since the second active portion 62 is positioned above the neutral plane S1, when the first active portion 61 contracts, the portions, of the ink separating layer 41 and the piezoelectric layers 42 to 44, overlapping with the piezoelectric chamber 10 are bent or flexed to be convex toward the pressure chamber 10 as a whole, as shown in FIG. 6A. In the following description, the portions, of the ink separating layer 41 and the piezoelectric layers 42 to 44, overlapping with the piezoelectric chamber 10 are referred to collectively as a pressure-chamber overlapping portion A.

Figure 6B:
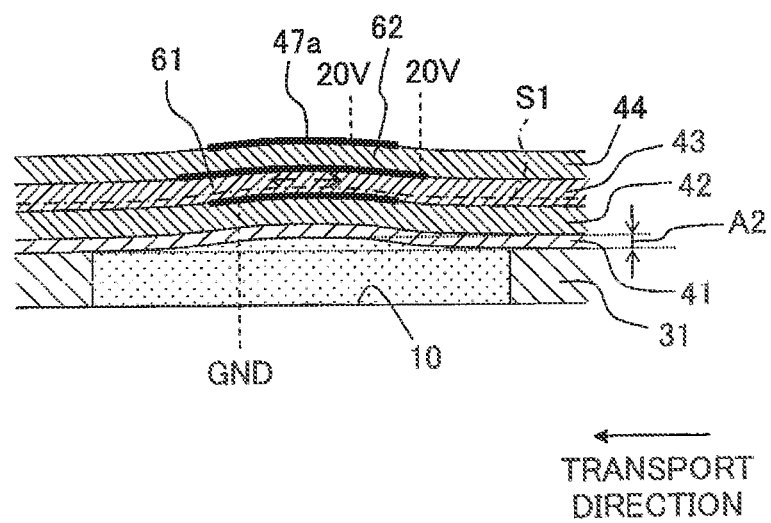

In a case that the ink is jetted from one nozzle 15, the electrical potential of the intermediate electrode 46 corresponding to this nozzle 15 is switched to a driving potential, and the driving potential is restored to the ground potential after a predetermined time has been elapsed. By switching the electrical potential of the intermediate electrode 46 to the driving potential, the intermediate electrode 46 has the same electrical potential as that of the upper electrode 47, which makes the second active portion 62 return to a state before the contraction. On the other hand, an electric field is generated in the first active portion 61 in a direction opposite to the polarization direction due to the potential difference between the intermediate electrode 46 and the lower electrode 45. This electric field causes the first active portion 61 to expand in the planar direction. Accordingly, as shown in FIG. 6B, the pressure-chamber overlapping portion A is bent or flexed to be convex toward the opposite side of the pressure chamber 10 as a whole.

Figure 7:
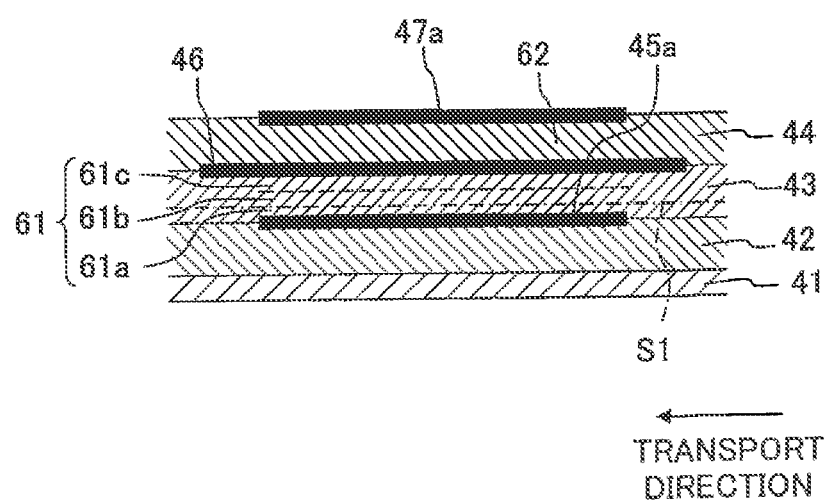
FIG. 7 is a view showing the relation between contraction of a first active portion and bending of the piezoelectric actuator.

To be explained in more detail, since the neutral plane S1 is located at the position on the lower side of the center plane T1 of the piezoelectric layer 43 in this embodiment, the thickness of a portion, of the first active portion 61, positioned on the upper side of the neutral plane S1 is thicker than the thickness of a portion, of the first active portion 61, positioned on the lower side of the neutral plane S1. As shown in FIG. 7, the portion, of the first active portion 61, positioned on the lower side of the neutral plane S1 will be referred to as a portion 61a; a portion, of the first active portion 61, which is positioned on the upper side of the neutral plane S1, continues to the portion 61a, and has the same thickness as the portion 61a, will be referred to as a portion 61b; and a portion, of the first active portion 61, positioned on the upper side of the neutral plane S1 and the portion 61b will be referred to as a portion 61c.

In a case that the driving potential is applied to the intermediate electrode 46, the portions, of the first active portion 61, positioned on the upper and lower sides of the neutral plane S1 expand integrally.

Accordingly, the expansion of the portions 61a and 61b of the first active portion 61 does not contribute to the bending or flexure of the pressure-chamber overlapping portion A. Only the expansion of the portion 61c contributes to the bending of the pressure-chamber overlapping portion A. Thus, when the electrical potential of the intermediate electrode 46 is switched to the driving potential, the expansion of the portion 61c of the first active portion 61 causes the pressure-chamber overlapping portion A to bend to be convex toward the opposite side of the pressure chamber 10 as a whole.

In this embodiment, the contraction of the entire second active portion 62 contributes to the bending of pressure-chamber overlapping portion A toward the pressure chamber 10, whereas only the expansion of the portion 61c of the first active portion 61 contributes to the bending of the pressure-chamber overlapping portion A toward the opposite side of the pressure chamber 10. Therefore, a bending amount A2 of the pressure-chamber overlapping portion A toward the opposite side of the pressure chamber 10 is smaller than a bending amount A1 of the pressure-chamber overlapping portion A toward the pressure chamber 10 caused by the contraction of the second active portion 62.

The bending of the pressure-chamber overlapping portion A to be convex toward the opposite side of the pressure chamber 10 increases the volume of the pressure chamber 10 to reduce the pressure of ink in the pressure chamber 10, thereby supplying the ink to the pressure chamber 10 from the manifold channel 11.

When the electrical potential of the intermediate electrode 46 is restored to the ground potential, the lower electrode 45 and the intermediate electrode 46 have the same electrical potential. Thus, the first active portion 61 returns to a state before the contraction, and similar to the above description, the second active portion 62 contracts in the planar direction, which causes the pressure-chamber overlapping portion A to bend to be convex toward the pressure chamber 10 as a whole. This reduces the volume of the pressure chamber 10 to increase the pressure of ink in the pressure chamber 10, thereby jetting the ink from the nozzle 15 communicating with the pressure chamber 10.

According to the above embodiment, the ink separating layer 41 and the piezoelectric layer 42 are arranged on the lower side of the piezoelectric layer 43, and the neutral surface S1 of the piezoelectric layer 22 is located at the position on the lower side of the center plane T of the piezoelectric layer 43. In the piezoelectric actuator 22, the lower electrode 45 is maintained at the ground potential, the upper electrode 47 is maintained at the driving potential, and any of the ground potential and the driving potential is selectively applied to the intermediate electrodes 46. Further, the first active portion 61 is polarized in the upward direction and the second active portion 62 is polarized in the downward direction opposite to the polarization direction of the first active portion 61. Thus, by switching the electrical potential of the intermediate electrode 46 between the ground potential and the driving potential, the pressure-chamber overlapping portion A is allowed to bend toward both the pressure chamber 10 and the opposite side of the pressure chamber 10. Therefore, it is possible to increase the bending amount of the pressure-chamber overlapping portion A.

In order to form the piezoelectric actuator 22, for example, the ink separating layer 41, the piezoelectric layer 42, the piezoelectric layer 43, and the piezoelectric layer 44 are stacked on each other. The piezoelectric layer 42 includes the lower electrode 45 arranged on the upper surface thereof. The piezoelectric layer 43 includes the intermediate electrodes 46 arranged on the upper surface thereof and plated through holes 39a, 39b formed therein. The piezoelectric layer 44 includes the upper electrode 47 arranged on the upper surface thereof and the plated through holes 39a formed therein. Then, this stacked body is, for example, sintered. However, there is fear that the positional deviation among the electrodes (the lower electrode 45, the intermediate electrodes 46 and the upper electrode 47) might occur when the ink separating layer 41 and the piezoelectric layers 42 to 44 are stacked. When the position deviation among the electrodes has occurred, and when an area in which each overlapping portion 45a of the lower electrode 45 overlaps with each intermediate electrode 46 and an area in which each intermediate electrode 46 overlaps with each overlapping portion 47a of the upper electrode 47 change or vary, the bending amount of the pressure-chamber overlapping portion A at the time of driving the piezoelectric actuator 22 changes. Such a problem is especially prominent when the position deviation between the lower electrode 45 and the intermediate electrodes 46 and the upper electrode 47 has occurred in the transport direction perpendicular to the longitudinal direction of each of the pressure chambers 10.

In this embodiment, however, the intermediate electrode 46 is longer, in the transport direction, than the overlapping portion 45a of the lower electrode 45 and the overlapping portion 47a of the upper electrode 47. The intermediate electrode 46 extends out beyond the overlapping portions 45a, 47a at both sides in the transport direction in a plan view. Therefore, even when the position deviation between electrodes 45 to 47 occurs in the transport direction to a certain degree, the area in which each overlapping portion 45a of the lower electrode 45 overlaps with each intermediate electrode 46 and the area in which each intermediate electrode 46 overlaps with each overlapping portion 47a of the upper electrode 47 do not change. Accordingly, it is possible to prevent the bending amount of the pressure-chamber overlapping portion A at the time of driving the piezoelectric actuator 22 from changing.

In this embodiment, any of the ground potential which is the same as that applied to the lower electrode 45 and the driving potential which is the same as that applied to the upper electrode 47 is selectively applied to the intermediate electrodes 46. Therefore, the present teaching is not required to include another power source independently from the power source for applying the electrical potential to each of the lower and upper electrodes 45, 47, a circuit for converting the electrical potential, which is outputted from the power source to apply the electrical potential to each of the lower and upper electrodes 45, 47, into the electrical potential for being applied to the intermediate electrodes 46, and the like, in order to apply the electrical potential to the intermediate electrodes 46. Thus, it is possible to simplify the construction of the apparatus.

In this embodiment, the ink-jet head corresponds to a liquid jetting apparatus according to the present teaching. The piezoelectric layer 43 corresponds to a first piezoelectric layer according to the present teaching, and the piezoelectric layer 44 corresponds to a second piezoelectric layer according to the present teaching. The piezoelectric layer 42 corresponds to a third piezoelectric layer according to the present teaching, and the ink separating layer 41 corresponds to a metallic layer according to the present teaching. The piezoelectric layer 42 and the ink separating layer 41 combined together corresponds to another layer according to the present teaching. The intermediate electrode 46 corresponds to a first electrode (a driving electrode) according to the present teaching, the lower electrode 45 corresponds to a second electrode (a first constant-potential electrode) according to the present teaching, and the upper electrode 47 corresponds to a third electrode (a second constant-potential electrode) according to the present teaching. The driver-IC 51 corresponds to a driving device according to the present teaching. The ground potential corresponds to a first electrical potential and a first driving potential according to the present teaching, and the driving potential corresponds to a second electrical potential and a second driving potential according to the present teaching.

Next, an explanation will be made about modification(s) in which various changes are applied to the above embodiment.

<First Modification>

In the above embodiment, each of the intermediate electrodes 46 extends out beyond one of the overlapping portions 45a of the lower electrode 45 and one of the overlapping portions 47a of the upper electrode 47, in a plan view, at both sides in the transport direction. The present teaching, however, is not limited to this construction.

Figure 8A:
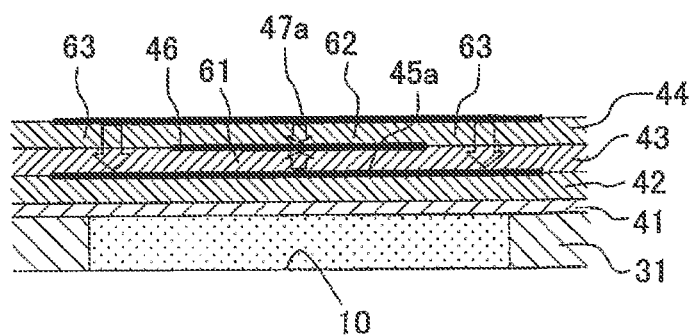
FIG. 8A is a view of a first modification which corresponds to FIG. 5A.
Figure 8B:
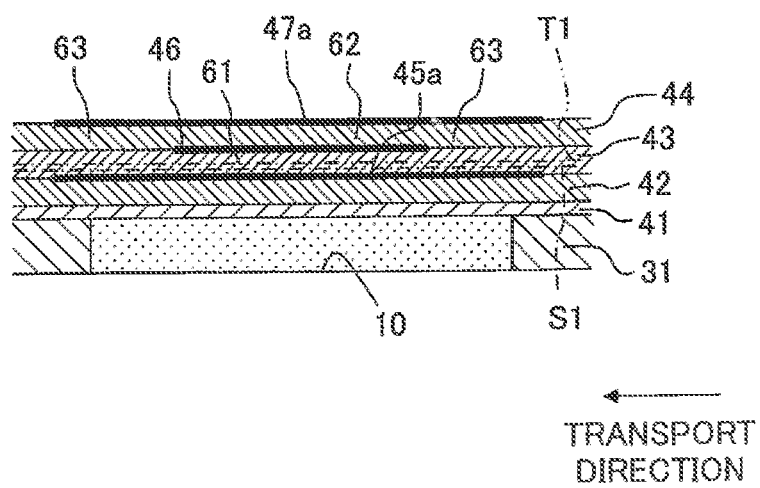
FIG. 8B is a view of the first modification which corresponds to FIG. 5B.

In the first modification, as shown in FIGS. 8A and 8B, the overlapping portions 45a, 47a are longer, in the transport direction, than the intermediate electrode 46. The overlapping portions 45a, 47a extend out beyond the intermediate electrode 46, in a plan view, at both sides in the transport direction. The portions, of the overlapping portions 45a, 47a, extending out beyond the intermediate electrode 46, extend out beyond portions overlapping with walls of the pressure chamber 10 in the transport direction. A third active portion 63 which is sandwiched between the overlapping portion 45a of the piezoelectric layer 43 and the overlapping portion 47a of the piezoelectric layer 44 and does not overlap with the intermediate electrode 46 is polarized downward.

Also in this case, since the overlapping portions 45a, 47a extend out beyond the intermediate electrode 46 at both sides in the transport direction, even when the position deviation between the electrodes 45 to 47 occurs in the transport direction to a certain degree, the area in which the overlapping portion 45a of the lower electrode 45 overlaps with the intermediate electrode 46 and the area in which the intermediate electrode 46 overlaps with the overlapping portion 47a of the upper electrode 47 do not change.

Further, in the first modification, an electric field is consistently generated in the third active portion 63 in a direction which is the same as the polarization direction due to the potential difference between the upper electrode 47 and the lower electrode 45 at the time of driving the piezoelectric actuator 22. This electric field causes the third active portion 63 to consistently contract in a planar direction. The contraction of the third active portion 63 causes the pressure-chamber overlapping portion A to consistently bend to be convex toward the opposite side of the pressure chamber 10.

Figure 9A:
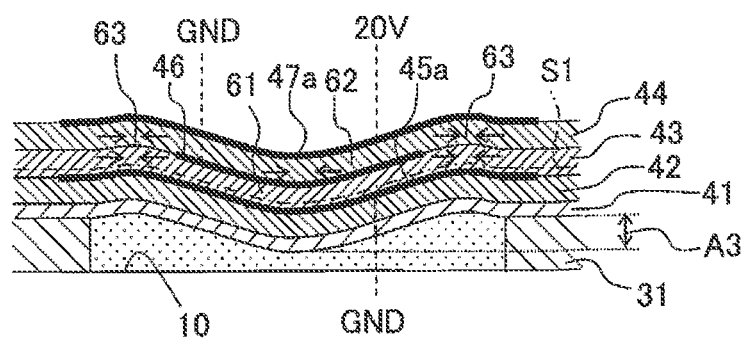
FIG. 9A is a view of the first modification which corresponds to FIG. 6A.
Figure 9B:
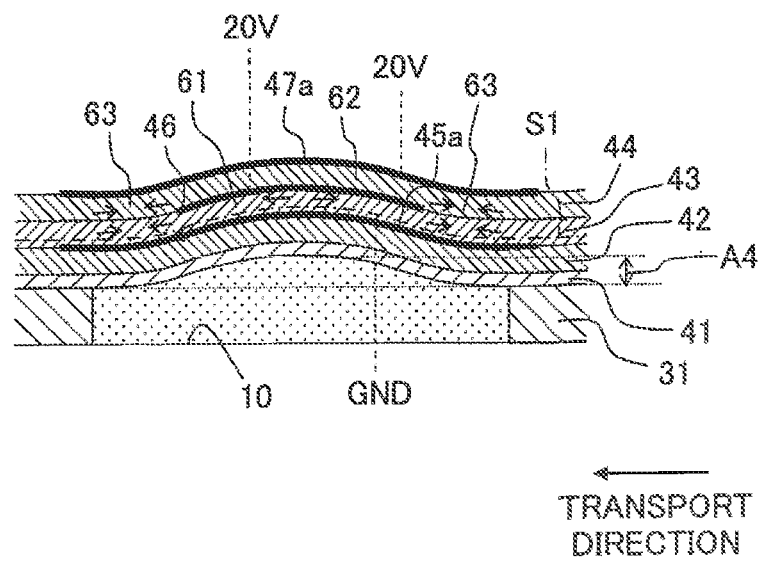
FIG. 9B is a view of the first modification which corresponds to FIG. 6B.

Therefore, as shown in FIG. 9A, a bending amount A3 of the pressure-chamber overlapping portion A toward the pressure chamber 10 at the time of making the electrical potential of the intermediate electrode 46 the ground potential is smaller than the bending amount A1 (see FIG. 6) in the above embodiment. On the other hand, as shown in FIG. 9B, a bending amount A4 of the pressure-chamber overlapping portion A toward the opposite side of the pressure chamber 10 at the time of making the electrical potential of the intermediate electrode 46 the driving potential is greater than the bending amount A2 (see FIG. 6) in the above embodiment. The sum of the bending amounts A3 and A4 is substantially the same as the sum of the bending amounts A1 and A2 of the above embodiment.

In a case that the pressure-chamber overlapping portion A corresponding to a certain pressure chamber 10 is bent, a pressure-chamber overlapping portion A corresponding to an adjacent pressure chamber 10 adjacent to the certain pressure chamber 10 is pulled in the transport direction. As a result, there is fear that so-called crosstalk might occur in which the bending of the pressure-chamber overlapping portion A corresponding to the certain pressure chamber 10 affects the bending amount of the pressure-chamber overlapping portion A corresponding to the adjacent pressure chamber 10. As the bending amount of the pressure-chamber overlapping portion A corresponding to the certain pressure chamber 10 is greater, the pressure-chamber overlapping portion A corresponding to the adjacent pressure chamber 10 is pulled with a stronger force, and thereby the influence of the crosstalk is greater.

In the above embodiment, the bending amount A1 of the pressure-chamber overlapping portion A toward the pressure chamber 10 is greater than the bending amount A2 toward the opposite side of the pressure chamber 10. Therefore, the influence of the crosstalk of when the pressure-chamber overlapping portion A is bent to be convex toward the pressure chamber 10 is greater than that of when the pressure-chamber overlapping portion A is bent to be convex toward the opposite side of the pressure chamber 10.

On the other hand, in the first modification, the bending amount of the pressure-chamber overlapping portion A toward the pressure chamber 10 is smaller and the bending amount of the pressure-chamber overlapping portion A toward the opposite side of the pressure chamber 10 is greater as compared with the above embodiment. Accordingly, both of the bending amounts A3 and A4 are smaller than the bending amount A1 in the above embodiment, which makes the greatest bending amount of the pressure-chamber overlapping portion A small. Thus, it is possible to reduce the influence of the crosstalk.

In the first modification, the overlapping portions 45a, 47a extend out beyond portions overlapping with walls of the pressure chamber 10 in the transport direction, and the third active portion 63 is polarized. The overlapping portions 45a, 47a, however, may extend up to the area overlapping with the pressure chamber 10 and/or the portion sandwiched between the overlapping portion 45a of the piezoelectric layer 43 and the overlapping portion 47a of the piezoelectric layer 44 may not be polarized.

<Second Modification>

Figure 10A:
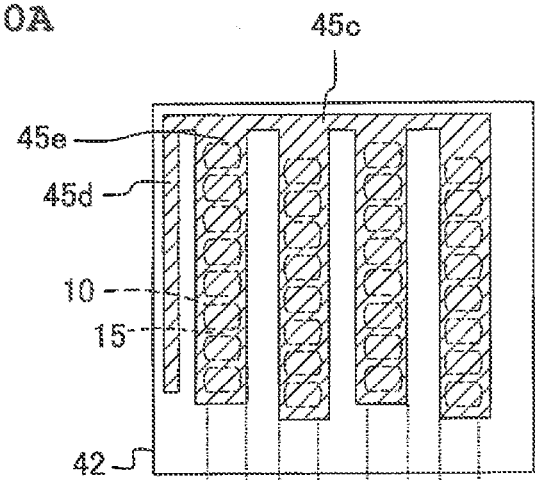
FIG. 10A is a view of a second modification which corresponds to FIG. 3A.
Figure 10B:
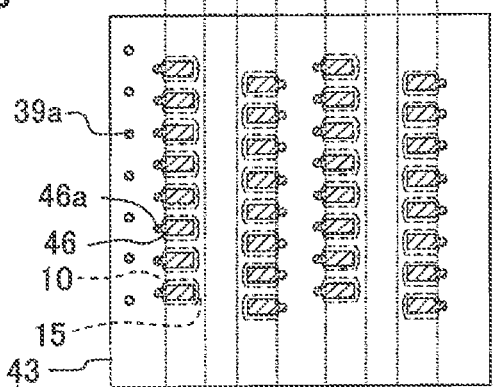
FIG. 10B is a view of the second modification which corresponds to FIG. 3B.
Figure 10C:
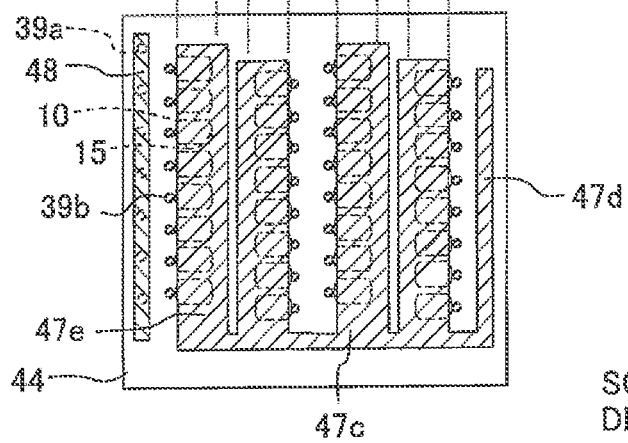
FIG. 10C is a view of the second modification which corresponds to FIG. 3C.

In a second modification, as shown in FIG. 10A, the lower electrode 45 includes four portions 45e, instead of the overlapping portions 45a and four connecting portions 45b. The four portions 45e correspond to four pressure chamber arrays 9, and each of the four portions 45e extends over the pressure chambers 10 constructing one of the pressure chamber arrays 9 in the transport direction. Further, as shown in FIG. 10C, the upper electrode 47 includes four portions 47e instead of the overlapping portions 47a and four connecting portions 47b. The four portions 47e correspond to four pressure chamber arrays 9, and each of the four portions 47e continuously extends over the pressure chambers 10 constructing one of the pressure chambers 9. The arrangement of the intermediate electrodes 46 is similar to that of the above embodiment, as shown in FIG. 10B.

In the second modification, the left end portions of the first and third portions 45e from the left side are positioned on the left side of the left end portions of the first and third portions 47e from the left side in the scanning direction in a plan view. The right end portions of the second and fourth portions 45e from the left side are positioned on the right side of the right end portions of the second and fourth portions 47e from the left side in the scanning direction in the plan view. The right end portions of the first and third portions 47e from the left side are positioned on the right side of the right end portions of the first and third portions 45e from the left side in the scanning direction in the plan view. The left end portions of the second and fourth portions 47e from the left side are positioned on the left side of the left end portions of the second and fourth portions 45e from the left side in the scanning direction in the plan view.

In the piezoelectric actuator 22 of the second modification, three electrodes including the portions 45e, 47e and the intermediate electrode 46 overlap with each other in the area in which the portions 45e, 47e overlap with each intermediate electrode 46. Further, two electrodes including the portions 45e, 47e overlap with each other in the area adjacent to both sides of each intermediate electrode 46 in the scanning direction.

A case, different from the second modification, in which the portions 45e, 47e corresponding with each other are arranged in the same range in the scanning direction, is taken into consideration. The piezoelectric actuator 22 of this case includes areas in which the portions 45e, 47e and the intermediate electrodes 46 overlap with each other; areas in which the portions 45e, 47e overlap with each other; and areas adjacent to both sides of the intermediate electrodes 46 in the scanning direction in which no electrodes 45 to 47 overlap with each other. In the piezoelectric actuator 22 of this case, the area in which the portions 45e, 47e overlap with each other is disposed adjacent to the area in which no electrodes overlap with each other, which increases the variation in thickness between the areas, of the piezoelectric actuator 22, arranged adjacent to each other.

However, in the second modification, the piezoelectric actuator 22 is configured such that one end portion of the portion 45e (47e) is deviated from one end portion of the portion 47e (45e) in the scanning direction. Thus, the piezoelectric actuator 22 of the second modification includes areas in which the portions 45e, 47e and the intermediate electrodes 46 overlap with each other, areas in which the portions 45e, 47e overlap with each other; areas in which no electrodes 45 to 47 overlap with each other, and areas in which one of the portions 45e, 47e is arranged. The area in which one of the portions 45e, 47e is arranged is positioned between the area in which the portions 45e, 47e overlap with each other and the area in which no electrodes 45 to 47 overlap with each other. That is, in the piezoelectric actuator 22 of the second modification, the area in which two electrodes overlap with each other is positioned adjacent to the area in which one electrode is arranged, and the area in which one electrode is arranged is positioned adjacent to the area in which no electrodes overlap with each other. Accordingly, it is possible to reduce the variation in thickness between the areas, of the piezoelectric actuator 22, arranged adjacent to each other.

In the above embodiment, the piezoelectric layer 42 is arranged under the lower surface of the piezoelectric layer 43, and the ink separating layer 41 made of a metallic material is arranged under the lower surface of the piezoelectric layer 42. The present teaching, however, is not limited to this. A layer disposed on the lower side of the piezoelectric layer 43 may be configured to be different from that of the above embodiment, for example, as follows: an ink separating layer 41 made of any material other than metal is arranged; no ink separating layer 41 is arranged; and a layer formed of any material other than the piezoelectric material is arranged instead of the piezoelectric layer 42. In a case that no problem is caused by the contact between the lower electrode 45 and the ink in the pressure chamber 10 because of the type of ink, etc., another layer may not be arranged on the lower side of the piezoelectric actuator 43. Also in these cases, the neutral plane S1 may be positioned on the lower side of the center plane T1 of the piezoelectric layer 43 because of the relations among Young's modulus of respective layers and the electrodes 45 to 47 of the piezoelectric actuator 22; the thicknesses of respective layers of the piezoelectric actuator 22; the areas of the electrodes 45 to 47; and the like.

<Third Modification>

In the above embodiment, the lower electrode 45 is maintained at the ground potential and the upper electrode 47 is maintained at the driving potential. The present teaching, however, is not limited to this. Unlike the above embodiment, the lower electrode 45 may be kept at the driving potential and the upper electrode 47 may be kept at the ground potential.

In this case, when the ground potential is applied to the intermediate electrode 46, an electric field occurs in the first active portion 61 in the direction which is the same as the polarization direction to cause the first active portion 61 to contract, which allows the pressure-chamber overlapping portion A to bend to be convex toward the opposite side of the pressure chamber 10 as a whole. On the other hand, when the driving potential is applied to the intermediate electrode 46, an electric field occurs in the second active portion 62 in the direction which is opposite to the polarization direction to cause the second portion 62 to expand, which allows the pressure-chamber overlapping portion A to bend to be convex toward the pressure chamber 10 as a whole. In this case, the bending amount of the pressure-chamber overlapping portion A toward the pressure chamber 10 is smaller than the bending amount of the pressure-chamber overlapping portion A toward the opposite side of the pressure chamber 10.

<Fourth Modification>

Figure 11A:
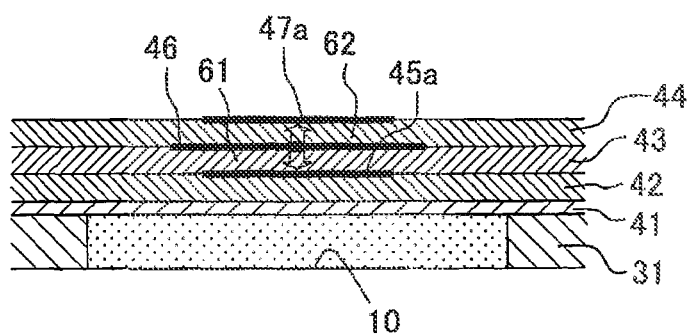
FIG. 11A is a view of a third modification which corresponds to FIG. 5A.
Figure 11B:
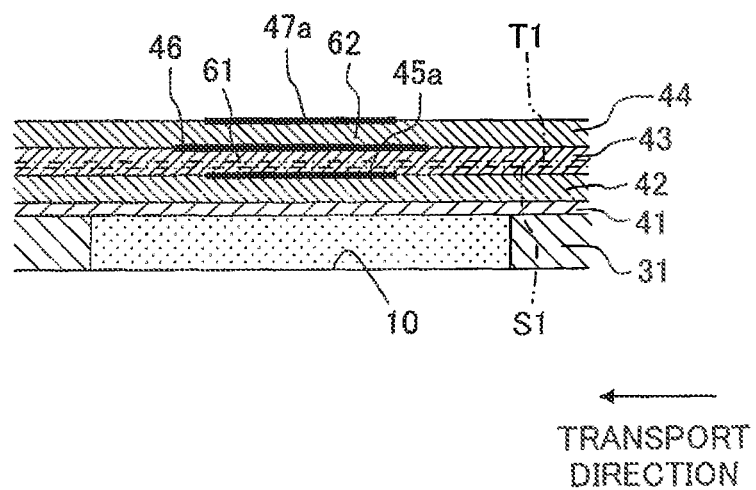
FIG. 11B is a view of the third modification which corresponds to FIG. 5B.

In the above embodiment, the first active portion 61 is polarized upward and the second active portion 62 is polarized downward. The present teaching, however, is not limited to this. In a fourth modification, as shown in FIGS. 11A and 11B, the first active portion 61 is polarized downward and the second active portion 62 is polarized upward.

In this case, when the ground potential is applied to the intermediate electrode 46, an electric field occurs in the second active portion 62 in the direction opposite to the polarization direction to cause the second active portion 62 to expand, which allows the pressure-chamber overlapping portion A to bend to be convex toward the opposite side of the pressure chamber 10 as a whole. On the other hand, when the driving potential is applied to the intermediate electrode 46, an electric field occurs in the first active portion 61 in the direction which is the same as the polarization direction to cause the first active portion 61 to contract, which allows the pressure-chamber overlapping portion A to bend to be convex toward the pressure chamber 10 as a whole. In this case, the bending amount of the pressure-chamber overlapping portion A toward the pressure chamber 10 is smaller than the bending amount of the pressure-chamber overlapping portion A toward the opposite side of the pressure chamber 10.

In the fourth modification, the lower electrode 45 is maintained at the ground potential and the upper electrode 47 is maintained at the driving potential. However, similar to the third modification, the lower electrode 45 may be maintained at the driving potential and the upper electrode 47 may be maintained at the ground potential in the fourth modification.

In the above embodiment, the neutral plane S1 of the piezoelectric actuator 22 is located at the position on the lower side of the center plane T1 of the piezoelectric layer 43. The present teaching, however, is not limited to this. For example, the neutral plane S1 may be located at another position on the lower side of the center plane T1 of the piezoelectric layer 43, such as the piezoelectric layer 42 and the ink separating layer 41. In this case, both of the first active portion 61 and the second active portion 62 are positioned above the neutral plane S1, and the first active portion 61 is separated farther from the neutral plane S1 than the second active portion 62. Therefore, the bending amount of the ink separating layer 41 and the piezoelectric layers 42 to 44 toward the pressure chamber 10 due to the contraction of the first active portion 61 is greater than the bending amount of the ink separating layer 41 and the piezoelectric layers 42 to 44 toward the opposite side of the pressure chamber 10 due to the expansion of the second active portion 62.

<Fifth Modification>

Figure 12A:
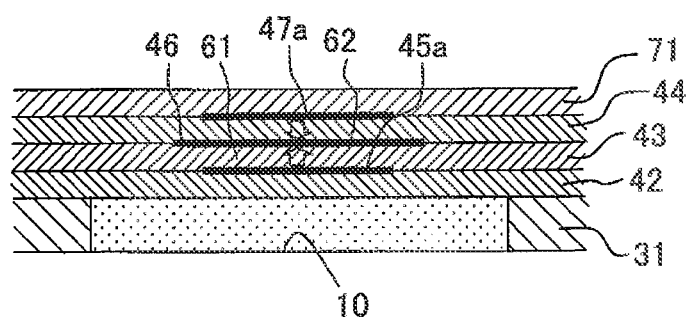
FIG. 12A is a view of a fifth modification which corresponds to FIG. 5A.
Figure 12B:
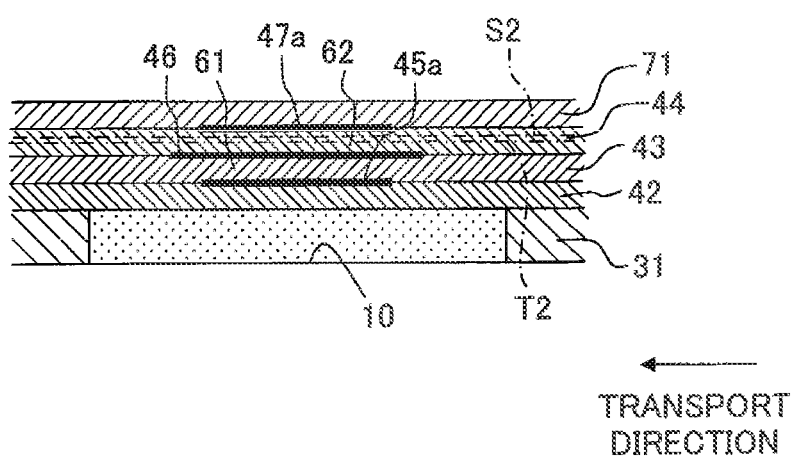
FIG. 12B is a view of the fifth modification which corresponds to FIG. 5B.

Further, the neutral plane S1 may not be located at the position on the lower side of the central plane T1 of the piezoelectric layer 43. In a fifth modification, as shown in FIGS. 12A and 12B, the piezoelectric actuator 22 has no ink separating layer 41, and a protective layer 71 for protecting the upper electrode 47 and the like is arranged on the upper surface of the piezoelectric layer 44. The neutral plane S2 of the piezoelectric actuator 22 is positioned above the central plane T2 of the piezoelectric layer 44 in the thickness direction, because of the relations among Young's modulus of the piezoelectric layers 42 to 44, the protective layer 71, and the electrodes 45 to 47; the thicknesses of the piezoelectric layers 42 to 44 and the protective layer 71; the areas of the electrodes 45 to 47; and the like. In this case, the extended portion 45d of the lower electrode 45, the connecting terminals 46a of the intermediate electrodes 46, and the extended portion 47d of the upper electrode 47 are pulled out to the upper surface of the protective layer 71 via plated through holes, and the pulled electrodes are connected to the COF 50 on the upper surface of the protective layer 71.

In this case, when the intermediate electrode 46 is made to be the ground potential, an electric field occurs in the second active portion 62 in the direction which is the same as the polarization direction to cause the second active portion 62 to contract in a planar direction, which allows the portions, of the piezoelectric layers 42 to 44 and the protective layer 71, overlapping with the pressure chamber 10 to bend to be convex toward the opposite side of the pressure chamber 10 as a whole. On the other hand, when the intermediate electrode 46 is made to be the driving potential, an electric field occurs in the first active portion 61 in the direction opposite to the polarization direction to cause the first active portion 61 to expand in the planar direction, which allows the portions, of the piezoelectric layers 42 to 44 and the protective layer 71, overlapping with the pressure chamber 10 to bend to be convex toward the pressure chamber 10 as a whole. In this case, the bending amount of the portions, of the piezoelectric layers 42 to 44 and the protective layer 71, overlapping with the pressure chamber 10 toward the pressure chamber 10 is greater than the bending amount toward the opposite side of the pressure chamber 10.

In the fifth modification, the piezoelectric layer 44 corresponds to the first piezoelectric layer according to the present teaching, and the piezoelectric layer 43 corresponds to the second piezoelectric layer according to the present teaching. The protective layer 71 corresponds to another layer according to the present teaching. The upper electrode 47 corresponds to the second electrode (the first constant-potential electrode) according to the present teaching, and the intermediate electrode 46 corresponds to the first electrode (the driving electrode) according to the present teaching, and the lower electrode 45 corresponds to the third electrode (the second constant-potential electrode) according to the present teaching. The ground potential corresponds to the first electrical potential and the first driving potential according to the present teaching, and the driving potential corresponds to the second electrical potential and the second driving potential according to the present teaching.

In the fifth modification, the lower electrode 45 may be maintained at the driving potential, and the upper electrode 47 may be maintained at the ground potential. Further, the first active portion 61 may be polarized downward and the second active portion 62 may be polarized upward.

In the fifth modification, the neutral plane of the piezoelectric actuator 22 may be positioned above the center plane T2 of the piezoelectric layer 44 not only in the case that the protective layer 71 is arranged on the upper surface of the piezoelectric layer 44, but also, for example, in a case that the thickness of the piezoelectric layer 43 is thicker than the thickness of the piezoelectric layer 42 and that the thickness of the piezoelectric layer 44 is thicker than the thickness of the piezoelectric layer 43.

In the embodiment and the modifications thereof explained above, any of the ground potential which is the same as that applied to the lower electrode 45 and the driving potential which is the same as that applied to the upper electrode 47 is selectively applied to the intermediate electrodes 46. The present teaching, however, is not limited to this. Any of another first driving potential, which causes an electric field in one of the first and second active portions 61, 62 in the direction which is the same as the polarization direction, and another second driving potential, which causes an electric field in the other of the first and second active portions 61, 62 in the direction which is opposite to the polarization direction may be selectively applied to the intermediate electrodes 46. For example, in the above embodiment and modifications, any of the first driving potential (for example, 18V) of which potential is slightly lower than the driving potential and the second driving potential (for example, 2V) of which potential is slightly higher than the ground potential may be selectively applied to the intermediate electrodes 46.

In the embodiment and the modifications thereof explained above, the explanations have been made with respect to the examples in which the present teaching is applied to the ink-jet head jetting ink of one color from nozzles and the piezoelectric actuator used for the ink-jet head. The present teaching, however, is not limited thereto. It is possible to apply the present teaching to an ink-jet head jetting inks of a plurality of colors and a piezoelectric actuator used for this ink-jet head. Further, it is possible to apply the present teaching to a liquid jetting apparatus, except for the ink-jet head, which jets liquid other than the ink and a piezoelectric actuator used for such a liquid jetting apparatus. Furthermore, it is possible to apply the present teaching to a piezoelectric actuator used for an apparatus other than the liquid jetting apparatus.

In the piezoelectric actuator according to the present teaching, the piezoelectric layer is not necessarily required to be PZT. It is possible to use a piezoelectric material having no lead. Further, the use of the piezoelectric actuator according to the present teaching is not limited to apply the pressure to the liquid in each pressure chamber formed in the stacked plates. For example, the piezoelectric actuator according to the present teaching may be used to apply the pressure to the liquid in each pressure chamber included in channels formed in a silicon substrate (silicon thin film) by etching.

What is claimed is:

1. A piezoelectric actuator, comprising:
a first piezoelectric layer;
a second piezoelectric layer;
a first electrode arranged between the first piezoelectric layer and the second piezoelectric layer,
a second electrode arranged so that the first piezoelectric layer is sandwiched between the second electrode and the first electrode and configured to be maintained at a first electrical potential; and
a third electrode arranged so that the second piezoelectric layer is sandwiched between the third electrode and the first electrode and configured to be maintained at a second electrical potential different from the first electrical potential,
wherein a neutral plane of the piezoelectric actuator is positioned inside the first piezoelectric layer further away from the second piezoelectric layer than a center plane of the first piezoelectric layer is from the second piezoelectric layer in a direction of stacking of the first and second piezoelectric layers,
wherein a first portion of the first piezoelectric layer is sandwiched between the first electrode and the second electrode, and a second portion of the second piezoelectric layer is sandwiched between the first electrode and the third electrode,
wherein the first and second portions are polarized parallel to the direction of stacking of the first and second piezoelectric layers, and
wherein a direction of polarization of the first portion is opposite to a direction of polarization of the second portion.

2. The piezoelectric actuator according to claim 1, further including another layer arranged under the first piezoelectric layer on a side opposite to the second piezoelectric layer.

3. The piezoelectric actuator according to claim 2, wherein the another layer includes a metallic layer made of a metallic material.

4. The piezoelectric actuator according to claim 3, wherein the another layer includes:
a third piezoelectric layer arranged under the first piezoelectric layer on the side opposite to the second piezoelectric layer; and
the metallic layer arranged under the third piezoelectric layer on a side opposite to the first piezoelectric layer.

5. The piezoelectric actuator according to claim 3, wherein the metallic layer is an ink separating layer and the metallic material has a higher Young's modulus than a material for the first and the second piezoelectric layers.

6. The piezoelectric actuator according to claim 1, wherein the first electrode extends out beyond the second and third electrodes in one direction as viewed from the direction of stacking of the first and second piezoelectric layers.

7. The piezoelectric actuator according to claim 1, wherein the first and third electrodes extend out beyond the second electrode in one direction as viewed from the direction of stacking of the first and second piezoelectric layers.

8. The piezoelectric actuator according to claim 7, wherein the first electrode, the second electrode, and the third electrode are formed as a plurality of first electrodes, a plurality of second electrodes, and a plurality of third electrodes, respectively,
wherein the piezoelectric actuator is configured to apply pressure to liquid in a plurality of pressure chambers aligned in the one direction,
the plurality of pressure chambers being configured to:
be covered with the first piezoelectric layer and the second piezoelectric layer;
overlap with the plurality of first electrodes, the plurality of second electrodes, and the plurality of third electrodes; and
be arranged such that wall portions of each pressure chamber in the predetermined direction overlap with the portions, of the first and third electrodes, extending out beyond each first electrode, and
wherein third active portions are polarized in a direction parallel to the first and second piezoelectric layers, the third active portions each extending over the first and second piezoelectric layers and sandwiched between the portion, of the second electrode, extending out beyond the first electrode and the portion, of the third electrode, extending out beyond the first electrode.

9. The piezoelectric actuator according to claim 1,
wherein the first electrode, the second electrode and the third electrode are formed as a plurality of first electrodes, a plurality of second, electrodes and a plurality of third electrodes, respectively,
wherein the plurality of first electrodes are aligned in an alignment direction;
the second electrode and the third electrode extend over the first electrodes in the alignment direction;
the second electrode extends out beyond the third electrode at one side in a direction perpendicular to the alignment direction; and
the third electrode extends out beyond the second electrode at the other side in the direction perpendicular to the alignment direction.

10. The piezoelectric actuator according to claim 1, wherein the first electrical potential is a first driving potential; and the second electrical potential is a second driving potential.

11. A liquid jetting apparatus, comprising:
a channel unit in which a liquid channel including a pressure chamber is formed;
a piezoelectric actuator configured to apply pressure to liquid in the pressure chamber; and
a driving device configured to drive the piezoelectric actuator,
the piezoelectric actuator including:
a first piezoelectric layer arranged to cover the pressure chamber;
a second piezoelectric layer;
a first electrode arranged between the first piezoelectric layer and the second piezoelectric layer to overlap with the pressure chamber;
a second electrode arranged so that a portion, of the first piezoelectric layer, overlapping with the pressure chamber is sandwiched between the second electrode and the first electrode; and a third electrode arranged so that a portion, of the second piezoelectric layer, overlapping with the pressure chamber is sandwiched between the third electrode and the first electrode, wherein a neutral plane of the piezoelectric actuator is positioned at a side opposite to the second piezoelectric layer relative to a center plane of the first piezoelectric layer in a direction of stacking of the first and second piezoelectric layers, wherein a first portion of the first piezoelectric layer is sandwiched between the first electrode and the second electrode, and a second portion of the second piezoelectric layer is sandwiched between the first electrode and the third electrode, wherein the first and second portions are polarized parallel to the direction of stacking of the first and second piezoelectric layers, and wherein a direction of polarization of the first portion is opposite to a direction of polarization of the second portion; and the driving device being configured to:
apply a first electrical potential to the second electrode;
apply a second electrical potential different from the first electrical potential to the third electrode; and
selectively apply, to the first electrode, one of a first driving potential and a second driving potential, the first driving potential generating an electric field in a direction which is the same as a polarization direction in one of the first and second portions and the second driving potential generating an electric field in a direction opposite to the polarization direction in the other of the first and second portions.

12. The liquid jetting apparatus according to claim 11, wherein the first portion and the second portion are overlapped with a central portion of the pressure chamber in the direction of stacking of the first and the second piezoelectric layers.

13. A piezoelectric actuator, comprising:
a first piezoelectric layer;
a second piezoelectric layer;
a first electrode arranged between the first piezoelectric layer and the second piezoelectric layer;
a second electrode arranged so that the first piezoelectric layer is sandwiched between the second electrode and the first electrode and configured to be maintained at a predetermined first electrical potential; and
a third electrode arranged so that the second piezoelectric layer is sandwiched between the third electrode and the first electrode and configured to be maintained at a second electrical potential different from the first electrical potential, wherein a first portion of the first piezoelectric layer is sandwiched between the first electrode and the second electrode, and a second portion of the second piezoelectric layer is sandwiched between the first electrode and the third electrode, wherein the first and second portions are polarized parallel to the direction of stacking of the first and second piezoelectric layers, wherein a direction of polarization of the first portion is opposite to a direction of polarization of the second portion; and wherein the piezoelectric actuator is configured to bend toward one side in the direction of stacking of the first and second piezoelectric layers, in a case that a first driving potential, which generates an electric field in a direction which is the same as a polarization direction in one of the first and second portions, is applied to the first electrode, and wherein the piezoelectric actuator is configured to bend toward an opposite side of said one side in the direction of stacking of the first and second piezoelectric layers, in a case that a second driving potential, which generates an electric field in a direction opposite to the polarization direction in the other of the first and second portions, is applied to the first electrode.

\* \* \* \* \*